Figure 1:
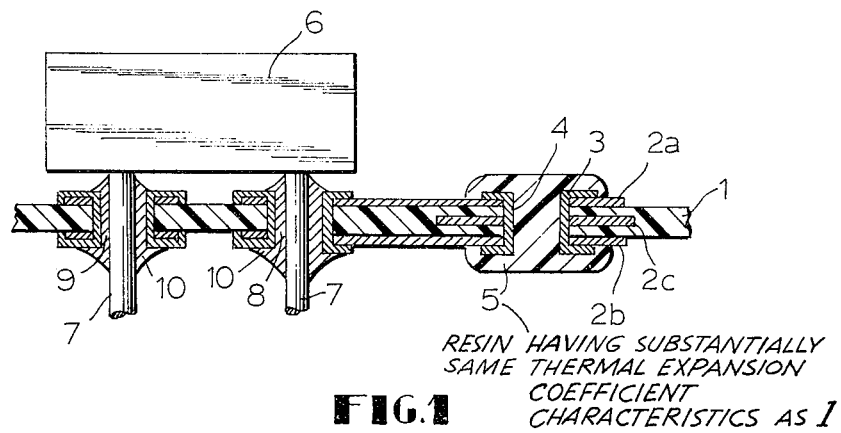

United States Patent [19]
Tsunashima

[11] 3,953,664
[45] Apr. 27, 1976

[54] PRINTED CIRCUIT BOARD
[75] Inventor: Eiichi Tsunashima, Hirakata, Japan
[73] Assignee: Matsushita Electric, Wireless Research Laboratory, Osaka, Japan
[22] Filed: Oct. 25, 1974
[21] Appl. No.: 518,219

[30] Foreign Application Priority Data
Oct. 26, 1973 Japan............................ 48-120878
Oct. 29, 1973 Japan............................ 48-121918

[52] U.S. Cl................................ 174/68.5; 29/626; 317/101 CC
[51] Int. Cl.² ........................................... H05K 1/18
[58] Field of Search ............... 174/68.5; 317/101 B, 317/101 C, 101 CC, 101 CM; 29/625, 626; 117/217; 317/261, 258

[56] References Cited
UNITED STATES PATENTS

| | | | |
|---|---|---|---|
| 2,758,267 | 8/1956 | Short | 317/258 X |
| 3,021,589 | 2/1962 | Weller | 317/261 UR |
| 3,346,689 | 10/1967 | Parstorfer | 174/68.5 |
| 3,471,631 | 10/1969 | Quintana | 174/68.5 |
| 3,534,147 | 10/1970 | Bratton et al. | 174/68.5 |
| 3,571,923 | 3/1971 | Shaheen et al. | 174/68.5 |
| 3,823,467 | 7/1974 | Shamash et al. | 29/590 X |

Primary Examiner—Darrell L. Clay
Attorney, Agent, or Firm—Wenderoth, Lind & Ponack

[57] ABSTRACT

An improved printed circuit board has an electrically insulating board which is made of a base containing synthetic resin, and has at least two conductors, one conductor being on one surface of said circuit board and the other conductor being on the opposite surface of the circuit board. At least one hole extends therethrough, and a conductive layer extends through the hole and covers at least part of the surface of the conductors for connecting the conductors on both surfaces of the circuit board through said hole. A filler composed of electrically insulating resin fills the hole and covers the surface of the layer for providing a highly reliable electrical connection between the two conductors on both surfaces of the circuit board.

3 Claims, 2 Drawing Figures

PRINTED CIRCUIT BOARD

This invention relates to a printed circuit board, and more especially to an improved printed circuit board in which the holes, which are formed through the board for connecting the conductors on both the surfaces of the board, are filled with an electrically insulating resin so as to avoid thermal shock owing to soldering and to provide an electrical connection between these conductors which is highly reliable even for a large change in temperature and humidity.

Conventionally, printed circuit boards are widely used in electronic equipment such as a radio receiver, a TV receiver, a tape recorder, a measuring equipment, a computer, etc. For miniaturization and simplification of electronic circuits and assembly thereof used in such an equipment and for effective use of the insulating board of the printed circuit board, there are conventionally formed conductors for electric connection and printed circuit components not just on one surface of the insulating board, but on both the surfaces thereof and/or on an inner layer thereof (multi-layer printed circuit board). In this case, it is required that these conductors be electrically connected to each other through a conductive path as short as possible. Such a conductive path is obtained by forming a hole through the circuit board and by providing a conductive means extending through the hole. For the conductive means, there is usually used a grommet, electrically conductive paint, a jumper wire, or a lead wire or a terminal of a discrete electronic component to be mounted on the circuit board, or there is formed a conductive layer by through-hole plating by chemical plating or by both chemical plating and electric plating. Further, the hole is soldered in order to support the electronic component mounted on the board mechanically in a stable way.

As the insulating board of the printed circuit board has an expansion coefficient and a contraction coefficient which are considerably different from those of the above described conductive means formed at the hole, respectively, conventionally there is a problem that there is caused a differential stress between the conductor at the hole and the insulating board owing to the difference of expansion and contraction thereof. When a laminated plate is used for the insulating board of the printed circuit board, the thermal expansion and contraction coefficients in the thickness direction thereof are about two to ten times larger than those in the lateral direction thereof. Further, for example, in an insulating board of resin laminated on a paper base, which is widely used as a printed circuit board, expansion due to humidity is larger by more than about ten times than the thermal expansion. Owing to these reasons, there is caused a large differential stress between the electric conductor formed through the hole and the wall of the hole, and the conductor at the hole is gradually broken and the conductors on both the surfaces of the board are disconnected.

That is, because of cycles of the increase and decrease of the ambient temperature of the insulating board and the temperature of the conductors on the insulating board and cycles of the humidity absorbing and exhausting of moisture by the insulating board, expansion and contraction of the insulating board are repeated, and so the effects of the stress on the conductor formed at the hole is accumulated and at last the conductor is broken. Although, there have been many studies and improvements such as in temperature and humidity dependencies of the dimensions of the insulating board and in the malleability of metal in order to solve this problem, there has not been provided a completely effective solution.

Therefore, an object of the present invention is to provide an improved printed circuit board in which conductors on both the surfaces of the board are electrically connected to each other through the hole.

Another object of the invention is to provide an improved printed circuit board having a highly reliable electrical connection between the conductors on both the surfaces of the board through the holes which is filled with an insulating resin.

A further object of the invention is to provide an improved printed circuit board having a stabilized performance, especially even when it is subjected to an atmosphere with high temperature and/or high humidity.

These objects of the present invention are achieved by providing an improved printed circuit board according to the invention, which comprises an electrically insulating board, which is made of a base containing synthetic resin, and has at least two conductors, one conductor being on one surface of said circuit board and the other conductor being on the opposite surface of said circuit board, a hole therethrough, and a conductive layer extending through said hole and covering at least part of the surface of said conductors for connecting said conductors on both the surfaces of said circuit board through said hole, and which is characterized by a filler composed of electrically insulating resin which fills said hole and covers the surface of said layer for providing a highly reliable electrical connection between said two conductors on both the surface of said circuit board.

Figure 2:
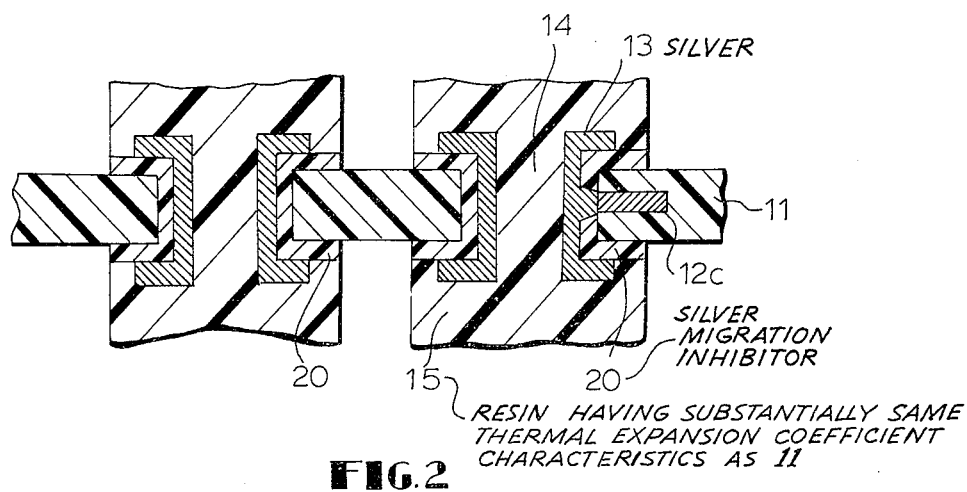

FIGS. 1 and 2 are schematic sectional views of the printed circuit board according to the present invention.

For the insulating board of the printed circuit board, on which electric circuit components such as conductors, resistors and capacitors are to be formed, there are widely used organic synthetic resin such as phenolic resin impregnated in a paper base and epoxy resin impregnated in a glass cloth base. In order to miniaturize and simplify the electric circuits and to use the circuit board effectively, usually both the surfaces of the board are used for forming the electric circuit components thereon. Sometimes, there is used a multi-layer printed circuit board having an inner layer of conductor. For example, on one surface, there is formed the conductor or the conductor and a printed circuit component such as a printed resistor, and on the opposite surface, the other conductor is formed and a discrete component is mounted. These conductors on both the surfaces of the board should be connected by a conductive path as short as possible. Usually, such a conductive path is provided through a hole formed to the board. The inventor of the present invention has found that there is obtained a great improvement in preventing breaking of the conductive path provided through the hole by filling the hole with an electrically insulating resin and hardening the filled resin by heating. In this case, the effect is especially large when using a resin having nearly the same expansion coefficient as that of the resin used in the insulating board.

FIG. 1 shows schematically a sectional view of a printed circuit board according to the present invention, in which on an electrically insulating board designated by reference numeral 1, which is made of a base containing synthetic resin, there are at least two conductors, i.e. a conductor 2a on one surface and conductor 2b on the opposite surface. The board 1 can have an inner layer of conductor 2c if it is a multi-layer printed circuit board. These conductors 2a, 2b and 2c are connected to each other by a conductive layer 3 extending through a hole 4 formed in the board 1. The conductive layer 3 covers at least part of the surface of the conductors on the board, as shown in FIG. 1. The hole 4 is filled with an electrically insulating resin 5. The resin 5 also covers part of the conductive layer, i.e. the layer on the surface of the board, and part of the conductors 2a and 2b, as shown in FIG. 1, and it is hardened by heating. As the resin 5 has a similar expansion and contraction during a change in temperature or humidity to those of the synthetic resin contained in the board 1, there is no differential stress produced between the insulating board 1 and the conductive layer 3 formed thereon. Accordingly, there is provided a highly reliable electric connection between the conductors 2a and 2b.

Usually, some discrete electric components are mounted on the printed circuit board. In FIG. 1, a discrete component 6 such as a resistor or a capacitor is mounted on the board 1 by inserting two lead wires 7 through other holes 8 and 9. One of the lead wires 7 is to be electrically connected to the conductors 2a and 2b. The lead wires 7 are fixed securely to the board 1 through the holes 8 and 9 by solder 10. The solder 10 also acts as a conductor for connecting the lead wire 7 and the conductive layer 3. Conventionally, there is a problem that sometimes the conductive layer 3 such as a throughhole plating is broken by thermal shock due to soldering. In the embodiment of FIG. 1 of the invention, in order to prevent such thermal shock, two holes 4 and 8 are formed through the board 1 for the same conductive path between the conductors 2a and 2b on both the surfaces of the board 1. That is, the hole 4 is filled with the resin 5 and the other hole 8 is soldered, as described above. Therefore, even if the conductive layer 3 extending through the hole 8 is broken by soldering, the electric connection between the conductors 2a and 2b is still securely maintained through the hole 3. In addition, the component 6 can be mecanically strongly mounted on the board 1 by means of the solder 10.

For the same conductive path, there may be formed a plurality of holes through the board according to the circuit arrangement, and for providing a highly reliable electric connection between the conductors on both the surfaces of the board, at least one of the holes is filled with the resin. Of course, more than two holes, which are not used for soldering or through which the lead wires of the discrete component are not inserted, may also be filled with the resin. Further, when the conductive layers are formed by two kinds of plating, i.e. electric plating and chemical plating, only the hole having the conductor layer formed by chemical plating may be filled with the resin, because the chemical plating layer is more weak than the electric plating layer. Usually, copper, nickel or silver is used for a plating metal. Also, as a layer of plated silver is not the best material for soldering, even though it has a superior property as an electric conductor means, it is effective that the hole having the conductive layer of plated silver be filled with the resin. This is also tone for the case of a conductive layer formed by a conductive paint, especially by a silver paint. In case of silver plating, it is desirable to plate silver at first as a substrate and then to plate another metal such as copper or nickel.

For a conductive layer formed by silver plating or silver paint, there may be a problem of migration of silver, that is silver migrates from a higher potential portion to a lower potential portion when the board is used, and there may be caused some problems. In order to overcome this problem, it is effective to form an underlayer containing an inhibitor for preventing migration of silver, before forming the conductive layer of silver plating or silver paint, at the place corresponding to that conductive layer. In FIG. 2, there is formed such an underlayer 20 through the hole 14 and covering part of the board 11 around the periphery of the hole 14. The conductive layer 13 is formed on the underlayer 20 by silver plating or by silver paint, and then the hole 14 is filled with the resin 15. This underlayer 20 is composed of resin and inhibitor. For the resin, thermosetting epoxy resin, unsaturated polyester resin, polybutadiene resin, etc. are preferable, and it is also possible to use melamine resin, alkyd resin, phenol resin, polyurethane resin, etc. The desirable materials for the inhibitor include amine compounds such as diethylamine and triethylamine and azole compounds such as benzotriazole and benzoimidazole. In order to prevent migration of silver, it is also effective to form an overlayer of a composition similar to that of the underlayer, and further it is more effective to use both the underlayer and the overlayer.

As described hereinbefore, the printed circuit board according to the invention is very effective not only for preventing thermal shock at soldering but also for providing a highly reliable electric connection between the conductors on both the surfaces of the board despite repeated large changes in temperature and humidity for a long time. The operable insulating resins for filling the hole through the board include thermosetting resin such as phenolic, epoxide, silicone and polyester and thermoplastic resin such as polyimide, polyethylene and polyfluoroethylene (Teflon), and desirably rigid ones such as epoxy resin and brominated epoxy resin are used because of better results. This is considered to be because epoxy resin or phenol denatured epoxy resin is often used for the insulating board. For example, practically there is used epoxy resin of epoxy equivalent 100 with diethylene triamine as a hardener and with benzoimidazole as an inhibitor. Further, an organic solvent such as methyl ethyl ketone or butyl acetate is added for getting better printing or filling. These solvents evaporate from the resin composition before hardening of the resin and do not remain. In the above described epoxy resin composition, the suitable hardening conditions are 120°C and 30 minutes. For safety of electronic equipment, it is desirable to make the resin self-extinguishing, for example by adding a non-flammable agent such as halogenide or phosphorus to the resin. Moreover, it is effective to disperse a further self-extinguishing assistant such as talc, silica and antimony trioxide into the resin.

The reliability of the connection through the hole according to the invention is evaluated by the following tests. For the insulating board for the tests, fire resistant one of a paper based phenolic resin impregnated laminate, FR-2 of NEMA grade in U.S.A. was used, and the following samples were prepared. Each sample group consisted of 50 sheets of the insulating plates in which there were formed 1000 holes through each of 50 sheets of the unsulating board 1.0 mm in diameter and at 2.5 mm intervals.

Sample A-0

There were formed conductive layers by chemically depositing a copper layer 0.5 $\mu$ thick through the holes and then by electric plating a copper layer of 2.5 $\mu$ thickness thereon.

Sample B-0

There were formed conductive layers by chemically depositing a copper layer 5 $\mu$ thick through the holes.

Sample C-0

There were formed conductive layer by applying silver paint (5504A of DuPont Co. in U.S.A.) on the walls of the holes 15 $\mu$ thick and by hardening the applied paint at 120°C for 10 minutes.

Sample A-1

The holes having the same through-hole plating as that of the example A-0 were filled with epoxy resin adhesive by using an injector, and the injected resin was hardened at 120°C for 30 minutes.

Sample B-1

The holes having the same through-hole plating as that of the example B-0 were filled with epoxy resin adhesive by using the injector, and the injected resin was hardened at 120°C for 30 minutes.

Samaple C-1

The holes having the same silver paint layer as that of the example C-0 were filled with epoxy resin adhesive by using the injector, and the injected resin was hardened at 120°C for 30 minutes.

For evaluating the effect of filling the holes with the insulating resin, there were carried out temperature cycle tests. That is, the samples were subjected to temperature cycles between the maximum temperature of 125°C and the minimum temperature of −55°C, being kept for 30 minutes at these temperatures, respectively. The resistance values were measured by applying a voltage of 100 $\mu$V with a frequency of 1KHz, and when the measured resistance value increased by more than +20% than the initial value, the samples were judged to have had a connection failure. The following table shows the number of failed boards for each of the sample groups evaluated by this evaluation.

Table

| Sample | number of temperature cycle 10 | 30 | 50 | 100 | 200 |
|---|---|---|---|---|---|
| A-0 | 0 | 5 | 11 | 38 | 50 |
| B-0 | 50 | — | — | — | — |
| C-0 | 0 | 0 | 1 | 2 | 5 |
| A-1 | 0 | 0 | 0 | 0 | 2 |
| B-1 | 0 | 5 | 9 | 18 | 31 |
| C-1 | 0 | 0 | 0 | 0 | 1 |

From the above table, it can be seen that for the reliability of the connection by the through-hole plating which is usually used at present, the reliability of the chemical plaing (sample B-0) is very low, and there are very many failures even for the electric plating (sample A-0) and still more failures even for the method of applying the silver paint (sample C-0). On the contrary, the reliability is remarkably increased by using the method according to the present invention.

For the problem of migration of silver, the conductive layers were formed by applying silver paint through the holes which are spaced apart by a distance of 2.5 mm and which are independent electrically from each other. Then, the samples were held in humidity of 90 to 95 % RH at 40°C for 1000 hours while applying DC voltage of 100 volts, and the time at which there was caused a short circuit was measured.

There were prepared three kinds of samples, that is (1) silver paint was directly applied through the holes formed in the FR-2 grade laminate board (sample A-2); (2) underlayers of epoxy resin containing inhibitors of both the amine compound and benzoimidazole were coated through the holes and then the silver paint was applied thereon (sample B-2); and (3) for the similar samples B-2, the holes were filled with the epoxy resin containing inhibitors of both the amine compound and benzoimidazole (sample C-2). The following table show the average time of the 10 sheets of samples.

| sample | average time of ten sheets of samples |
|---|---|
| A-2 | 25 hours |
| B-2 | 470 hours |
| C-2 | 960 hours |

What is claimed is:

1. In a printed circuit board, the combination of an electrically insulating board which is made of a base containing synthetic resin and having at least two conductors, one conductor being on one surface of said circuit board and the other conductor being on the opposite surface of said circuit board, said board having a plurality of holes therethrough, a conductive layer extending through one hole and covering at least part of the surface of said conductors connecting said conductors on both the surfaces of said circuit board through said one hole, and a filler composed of electrically insulating resin which fills said one hole and covers the surface of said conductive layer for preventing breakage of the conductive path through the hole containing the filler, the filler of insulating resin having a thermal coefficient of expansion characteristics which are substantially the same thermal coefficient of expansion characteristics as the material of the insulating board, another of said holes being soldered, the two holes forming redundant electrical connection paths between said conductors on both surfaces of said board, whereby undesirable thermal shock owing to the soldering is avoided in the hole filled with said resin.

2. The combination as claimed in claim 1 wherein said circuit board has at least one discrete electronic component having a lead wire connector to said conductors on both surfaces of said board, said lead wire of said electric component extending through said other hole and within said solder and providing an electrical connection between said electronic component and said conductive layer and mechanical support for said component.

3. In a printed circuit board, the combination of an electrically insulating board which is made of a base containing synthetic resin and having at least two conductors, one conductor being on one surface of said circuit board and the other conductor being on the opposite surface of said circuit board, said board having a plurality of holes therethrough, forming redundant electrical connection paths between said conductors on both surfaces of said board, a conductive layer of conductive silver paint extending through one hole and covering at least part of the surface of said conductors for connecting said conductors on both the surfaces of said circuit board through said one hole, an underlayer of electrically insulating resin containing an additive for suppressing migration of silver contained in said silver paint, said underlayer being at the places corresponding to said conductive layer, and a filler composed of electrically insulating resin which fills said one hole and covers the surface of said conductive layer for preventing breakage of the conductive path through the hole containing the filler, the filler of insulating resin having thermal coefficient of expansion characteristics which are substantially the same thermal coefficient of expansion characteristics as the material of the insulating board.

* * * * *